(12) United States Patent
Zang et al.

(10) Patent No.: US 9,842,927 B1
(45) Date of Patent: Dec. 12, 2017

(54) INTEGRATED CIRCUIT STRUCTURE WITHOUT GATE CONTACT AND METHOD OF FORMING SAME

(71) Applicant: GLOBALFOUNDRIES Inc., Grand Cayman (KY)

(72) Inventors: Hui Zang, Guilderland, NY (US); Manfred J Eller, Beacon, NY (US); Min-Hwa Chi, San Jose, CA (US); Jerome J. B. Ciavatti, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/248,367

(22) Filed: Aug. 26, 2016

(51) Int. Cl.
| | |
|---|---|
| *H01L 29/49* | (2006.01) |
| *H01L 29/43* | (2006.01) |
| *H01L 27/092* | (2006.01) |
| *H01L 21/28* | (2006.01) |
| *H01L 29/78* | (2006.01) |
| *H01L 29/66* | (2006.01) |
| *H01L 29/417* | (2006.01) |

(52) U.S. Cl.
CPC ...... *H01L 29/783* (2013.01); *H01L 29/41775* (2013.01); *H01L 29/4975* (2013.01); *H01L 29/66545* (2013.01); *H01L 29/66795* (2013.01)

(58) Field of Classification Search
CPC .............. H01L 29/783; H01L 29/4975; H01L 29/41775; H01L 29/66545; H01L 29/66795

USPC .......... 257/401, 288, 369, 410, 412, 43, 77, 257/E21.19, E21.409, E29.255; 438/216, 438/294, 301, 283, 287, 592

See application file for complete search history.

(56) References Cited

U.S. PATENT DOCUMENTS

| | | | |
|---|---|---|---|
| 9,324,796 B2 * | 4/2016 | Cheng | H01L 29/0673 |
| 2008/0272398 A1 | 11/2008 | Bronner et al. | |
| 2013/0328111 A1 * | 12/2013 | Xie | H01L 21/28 257/288 |
| 2016/0020118 A1 * | 1/2016 | Park | H01L 21/28088 438/592 |
| 2016/0181366 A1 * | 6/2016 | Oh | H01L 21/845 257/77 |
| 2016/0315087 A1 * | 10/2016 | Tseng | H01L 21/823857 |

OTHER PUBLICATIONS

M. Rashed, et al., "Innovations in Special Constructs for Standard Cell Llibraries in Sub 28nm Technologies", IEDM, p. 248, 2013.

* cited by examiner

*Primary Examiner* — Dao H Nguyen
(74) *Attorney, Agent, or Firm* — Yuanmin Cai; Hoffman Warnick LLC

(57) ABSTRACT

One aspect of the disclosure relates to an integrated circuit structure. The integrated circuit structure may include: a gate structure between a pair of gate spacers within a dielectric layer and substantially surrounding a fin, wherein the gate structure is disposed adjacent to a channel region within the fin; and a source/drain contact extending within the dielectric layer to a source/drain region within a fin, the source/drain contact being separated from the gate structure by at least one gate spacer in the pair of gate spacers, wherein the channel region and the source/drain region provide electrical connection between the gate structure and the source/drain contact.

13 Claims, 14 Drawing Sheets

INTEGRATED CIRCUIT STRUCTURE WITHOUT GATE CONTACT AND METHOD OF FORMING SAME

BACKGROUND

Technical Field

The present disclosure relates to integrated circuit structures, and more particularly, to an integrated circuit structure without a gate contact and method of forming the same.

Related Art

Advanced manufacturing of integrated circuits requires formation of individual circuit elements, e.g., field-effect-transistors (FETs) and the like based on specific circuit designs. A FET generally includes source, drain, and gate terminals. The gate terminal is placed between the source and drain terminals and controls the current therebetween. Transistors may be formed over a substrate and may be electrically isolated with an insulating dielectric layer, e.g., inter-level dielectric layer. Contacts may be formed to each of the source, drain, and gate terminals through the dielectric layer in order to provide electrical connection between the transistors and other circuit elements that may be formed subsequent to the transistor in other metal levels. As integrated circuits continue to be scaled down, real estate within the integrated circuit becomes more valuable. Additionally, scaled spacing and contact pitch becomes more difficult to control.

SUMMARY

A first aspect of the disclosure provides for a method of forming an integrated circuit structure. The method may include: removing a dummy gate stack from between a pair of gate spacers within a dielectric layer thereby forming a first opening within the dielectric layer, the first opening exposing a portion of a fin and a portion of a shallow trench isolation (STI) region that is adjacent to the fin; forming a gate structure within the first opening; forming a second opening within the dielectric layer to expose a source/drain region within the fin, the second opening being adjacent to the gate structure; and forming a source/drain contact within the second opening to the source/drain region.

A second aspect of the disclosure provides for an integrated circuit structure. The integrated circuit structure may include: a gate structure between a pair of gate spacers within a dielectric layer and substantially surrounding a fin, wherein the gate structure is disposed adjacent to a channel region within the fin; and a source/drain contact extending within the dielectric layer to a source/drain region within a fin, the source/drain contact being separated from the gate structure by at least one gate spacer in the pair of gate spacers, wherein the channel region and the source/drain region provide electrical connection between the gate structure and the source/drain contact.

A third aspect of the disclosure provides for an integrated circuit structure. The integrated circuit structure may include: a source/drain contact to a source/drain region, the source/drain contact being adjacent to a gate structure and being directly connected to a gate conductor of the gate structure through a sidewall of the gate structure.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 28 shows a resulting IC structure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The present disclosure relates to an integrated circuit (IC) structure, and more particularly, to an integrated circuit structure without a gate contact and method of forming the same.

Figure 1:
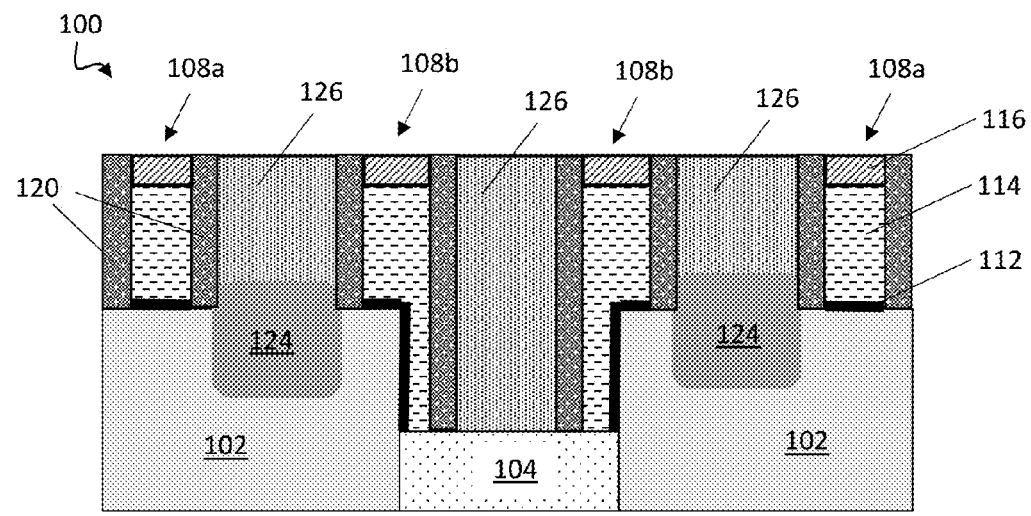
FIGS. 1-6 show a preliminary integrated circuit (IC) structure undergoing aspects of a method according to one embodiment of the disclosure.

FIG. 1 shows a preliminary IC structure 100. In some embodiments (shown), IC structure 100 may be a Static Random Access Memory (SRAM) fin-shaped field effect transistor (FinFET). However, it is to be understood that embodiments of the disclosure are also equally applicable to other types of transistors. IC structure 100 may include fins 102 substantially isolated from one another by a shallow trench isolation (STI) region 104. Fins 102 may be patterned and etched from a substrate (not shown) as known in the art. Further, a trench (not shown) may be patterned and etched into the substrate between adjacent fins. An insulator, e.g., silicon dioxide, may be formed, e.g., deposited, to form STI region 104. As known in the art, STI region 104 separates or isolates adjacent semiconductor devices that are on the same plane from one another. STI region 104 prevents electrical current leakage from the adjacent semiconductor devices, e.g., fins 102. After deposition of the insulator, the insulator may be annealed to form STI region 104 as is known in the art.

As used herein, "substantially" refers to largely, for the most part, entirely specified or any slight deviation which provides the same technical benefits of the invention. As used herein "approximately" is intended to include values, for example, within 10% of the stated values. As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

"Etching" generally refers to the removal of material from a substrate or structures formed on the substrate by wet or dry chemical means. In some instances, it may be desirable to selectively remove material from certain areas of the substrate. In such an instance, a mask may be used to prevent the removal of material from certain areas of the substrate. There are generally two categories of etching, (i) wet etch and (ii) dry etch. Wet etching may be used to selectively dissolve a given material and leave another material relatively intact. Wet etching is typically performed with a solvent, such as an acid. Dry etching may be performed using a plasma which may produce energetic free radicals, or species neutrally charged, that react or impinge at the surface of the wafer. Neutral particles may attack the wafer from all angles, and thus, this process is isotropic. Ion milling, or sputter etching, bombards the wafer with energetic ions of noble gases from a single direction, and thus, this process is highly anisotropic. A reactive-ion etch (RIE) operates under conditions intermediate between sputter etching and plasma etching and may be used to produce deep, narrow features, such as trenches.

IC structure 100 may also include dummy gate stacks 108a, 108b over fins 102 and/or STI region 104. Dummy gate stacks 108a, 108b may substantially surround portions of fins 102. As shown, dummy gate stacks 108a may be formed over and around fins 102, while dummy gate stacks 108b may be formed such that dummy gate stacks 108b straddle both portions of fins 102 and portions of STI region 104. Dummy gate stacks 108a, 108b may include a gate dielectric layer 112, a dummy gate material 114 over gate dielectric layer 112, and a cap layer 116 over dummy gate material 114. Dummy gate stacks 108a, 108b may be disposed between a pair of gate spacers 120. Gate spacers 120 may be disposed over the substrate such that gate spacers 120 are disposed over and around fins 102 and STI region 104 on opposing sides of gate stacks 108a, 108b.

Dummy gate stacks 108a, 108b and gate spacers 120 may be formed by conventional lithographic techniques. For example, gate spacers 120 may be formed by depositing gate spacer material over fins 102 and STI region 104. Gate spacers 120 may be patterned and etched to their desired orientation. Dummy gate stacks 108a, 108b may each be formed between a pair of gate spacers 120 by depositing gate dielectric layer 112 such that gate dielectric layer 112 substantially lines gate spacers 120 and a region between gate spacers 120. Dummy gate material 114 may be deposited over gate dielectric layer 112. Subsequently, gate dielectric layer 112 and dummy gate material 114 may be planarized to a top surface of gate spacers 120 such that any portions of gate dielectric layer 112 and dummy gate material 114 that are not between a pair of gate spacers 120 is removed. Subsequently, dummy gate material 114 may be recessed and cap layer 116 may be formed over the recessed dummy gate material 114. Cap layer 116 may be planarized to a top surface of gate spacers 120. Although not mentioned for brevity, it is to be understood than any of these processes can be formed with a mask in place. Gate dielectric layer 112 may include conventional gate dielectric materials, such as for example, silicon dioxide. Dummy gate material 114 may include conventional dummy gate materials known in the art, such as for example, polysilicon or amorphous silicon. Cap layer 116 may include conventional gate cap layers, such as for example, titanium nitride. As known in the art, dummy gate stacks 108a, 108b enable IC structure 100 to undergo additional processing before active gate stacks are formed in order to prevent damage to active gate stacks. Gate spacers 120 may include conventional gate spacer material, such as for example, silicon nitride.

Planarization refers to various processes that make a surface more planar (that is, more flat and/or smooth). Chemical-mechanical-polishing (CMP) is one currently conventional planarization process which planarizes surfaces with a combination of chemical reactions and mechanical forces.

Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

A "mask" is a material or stack of materials which may be formed over an underlying material which is to be processed. The mask may be patterned to have openings such that the underlying material is exposed. Subsequently, the underlying material may be processed where the underlying material is exposed by the openings in the mask. Once the underlying material is processed, the mask may be removed. Conventional masking materials include photoresist, silicon oxide, amorphous carbon, spin-on materials and silicon nitride.

Still referring to FIG. 1, source/drain regions 124 may be formed from exposed portions of fins 102, e.g., between adjacent dummy gate stacks 108a, 108b. Source/drain regions 124 may be formed by depositing and/or epitaxial growth of semiconducting material on or around fins 102. For example, source/drain regions 124 may be formed by growth of an epitaxial material from fins 102 such that the epitaxial material surrounds fins 102 as known in the art. The epitaxial material may be chosen dependent on whether a p-type field-effect-transistor (PFET) or an n-type field-effect-transistor (NFET) is desired. In one example, where an NFET is desired, silicon may be epitaxially grown and subsequently doped with an n-type dopant, e.g., carbon, such that epitaxial material includes carbon-doped silicon. In another example, where a PFET is desired, silicon germanium may be epitaxially grown and subsequently doped with a p-type dopant, e.g., boron, such that epitaxial material includes boron-doped silicon germanium. In another example (shown), source/drain regions 124 may be formed by implanting n-type or p-type dopants directly into fins 102 and annealing as known in the art.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

IC structure 100 may also include a dielectric layer 126 over fins 102 (including any epitaxial material surrounding fin) and substantially surrounding dummy gate stacks 108a, 108b and gate spacers 120. Dielectric layer 126 may include, for example, silicon nitride, silicon oxide, fluorinated $SiO_2$ (FSG), hydrogenated silicon oxycarbide (SiCOH), porous SiCOH, boro-phospho-silicate glass (BPSG), silsesquioxanes, carbon doped oxides (i.e., organosilicates) that include atoms of silicon, carbon, oxygen, and/or hydrogen, thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. Dielectric layer 126 may be formed by deposition of the dielectric layer material and planarization of the dielectric material to a top surface of gate stacks 108a, 108b.

Figure 2:
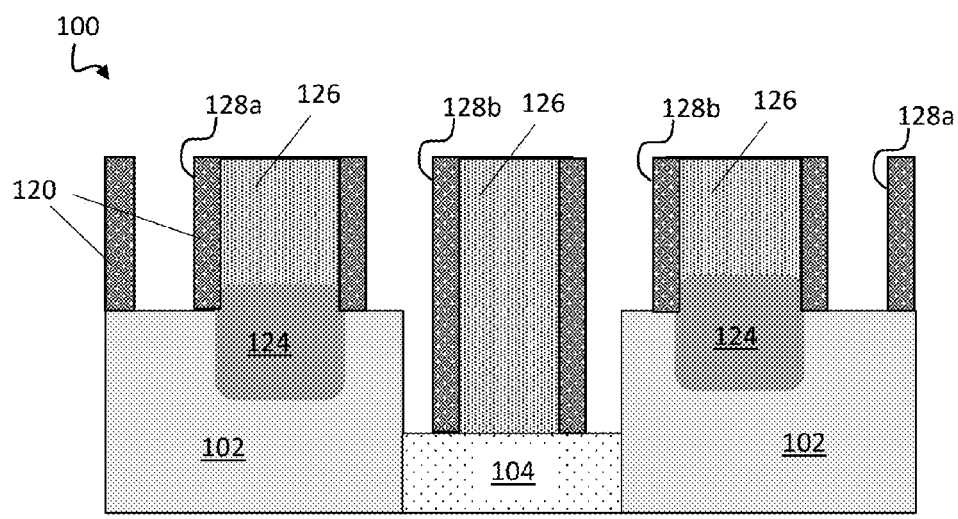

Turning now to FIG. 2, dummy gate stacks 108a, 108b may be removed, e.g., via etching, to create openings 128a, 128b between gate spacers 120. That is, cap layer 116, dummy gate material 114, and gate dielectric layer 112 may be removed to expose portions of fins 102 and/or STI region 104 thereunder. As shown, openings 128a may be formed over and around fins 102, while openings 128b may straddle portions of fins 102 and portions of STI region 104. To remove dummy gate stacks 108a, 108b, a mask (not shown) may be formed over IC structure 100 and patterned and etched to expose top surfaces of dummy gate stacks 108a, 108b, or more particularly, cap layer 116. Subsequently, dummy gate stacks 108a, 108b may be removed followed by removal of the mask.

Figure 3:
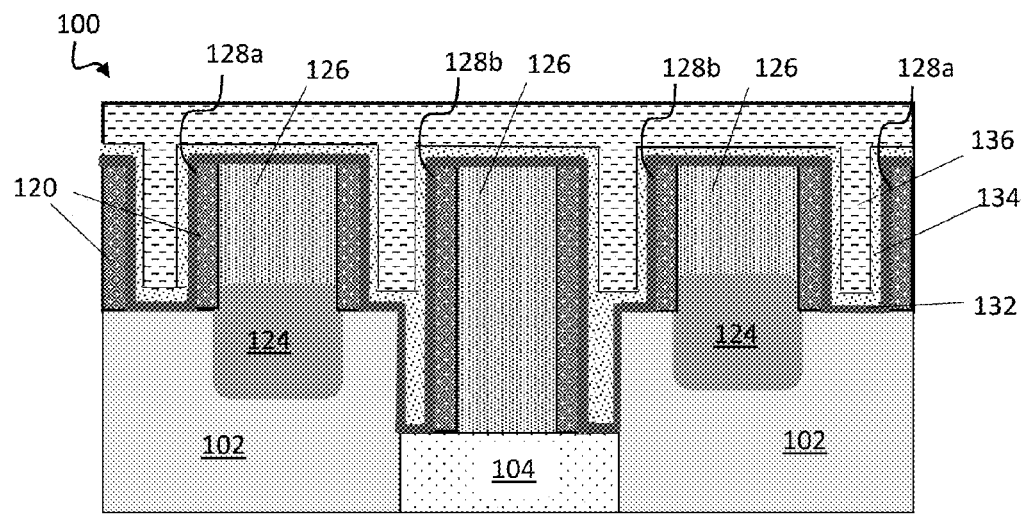

As shown in FIG. 3, a layer having a high dielectric constant (high-k layer) 132 may be conformally deposited over IC structure 100 such that high-k layer 132 substantially lines openings 128a, 128b and the field between openings 128a, 128b. Further, a capping layer 134 may be conformally deposited over high-k layer 132. After capping layer 134 is formed, another dummy gate material 136 may be conformally deposited over capping layer 134 to substantially fill openings 128a, 128b. Subsequently, an anneal, e.g., a rapid thermal anneal (RTA) at 1000° C., may be performed. High-k layer 132 may include any conventional high-k materials, such as for example, an insulating material whose dielectric constant (k) is greater than that of silicon dioxide, e.g., greater than 4.0. High-k layers 132 may include, for example, at least one of: hafnium oxide, hafnium silicate, nitride hafnium silicate, zirconium oxide, zirconium silicate, titanium oxide, lanthanum oxide, yttrium oxide, aluminum oxide, or combinations thereof. Capping layer 134 may include any conventional capping layer materials, such as for example, titanium nitride. Further, dummy gate material 136 may include any of the dummy gate materials discussed herein.

Figure 4:
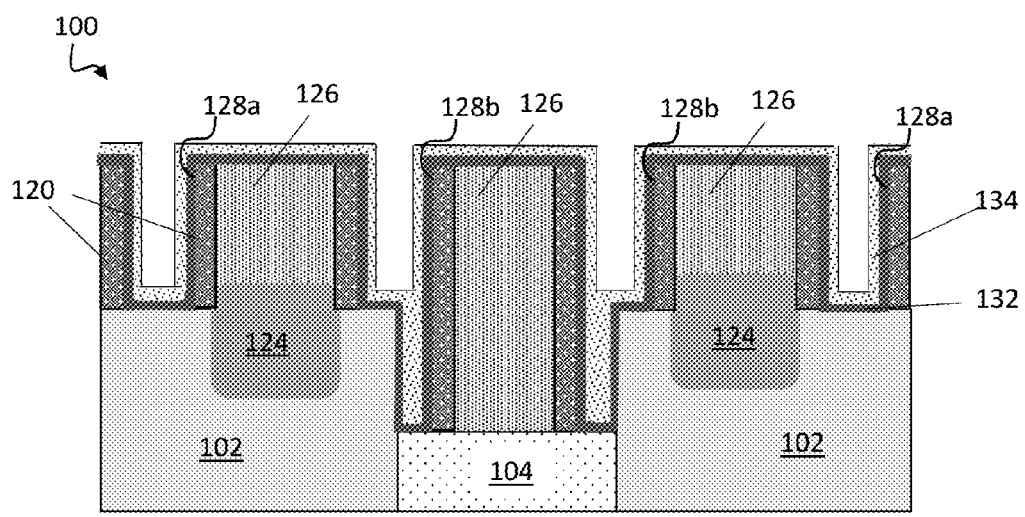
Figure 5:
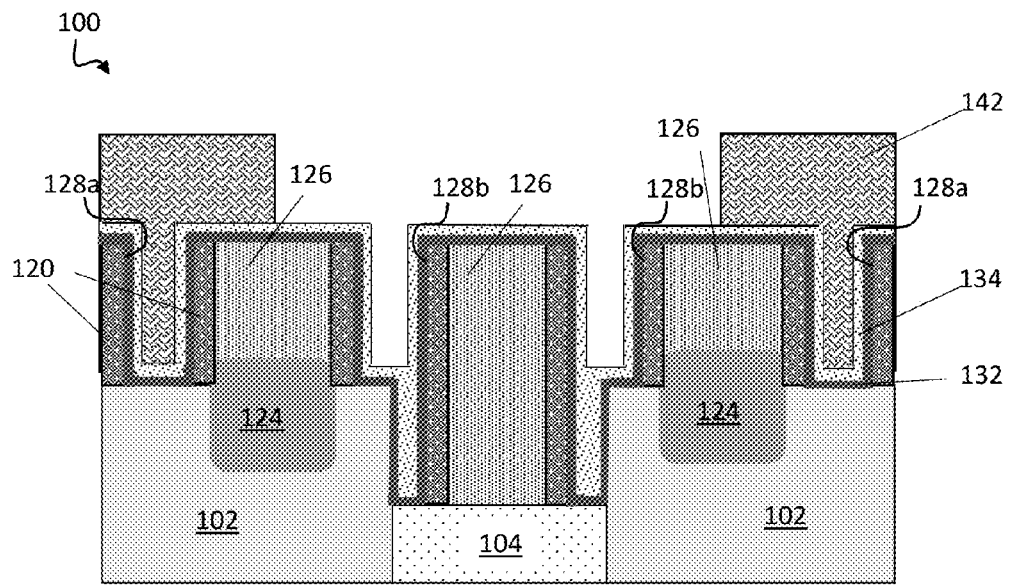
Figure 6:
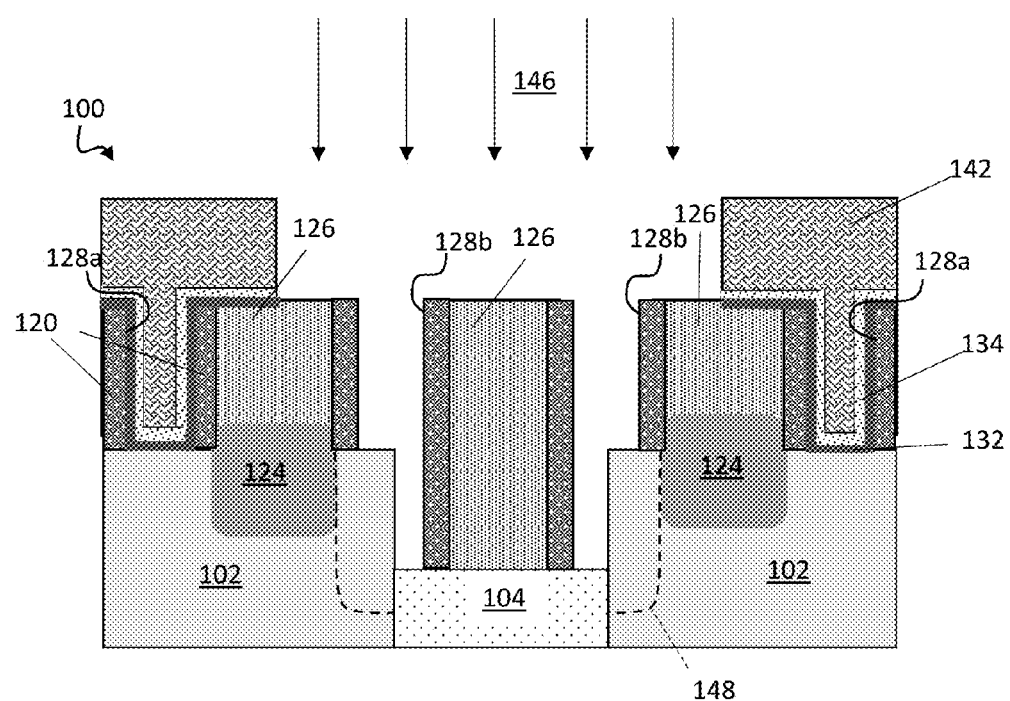

After the anneal, dummy gate material 136 may be removed from openings 128a, 128b, e.g., via etching, from IC structure 100 to expose capping layer 134 thereunder as shown in FIG. 4. Subsequently, a mask 142 may be formed over IC structure 100, or more particularly, over exposed capping layer 134 as shown in FIG. 5. Mask 142 may be patterned and etched such that capping layer 134 within openings 128a remains covered by mask 142, while capping layer 134 within openings 128b is not covered by mask 142, or is otherwise exposed. Further, portions of capping layer 134 within the field adjacent to and between openings 128b may also be exposed or uncovered by mask 142. Turning to FIG. 6, exposed portions of capping layer 134 and high-k layer 132 thereunder may be removed, e.g., via etching. The removal of capping layer 134 and high-k layer 132 exposes portions of fins 102 and STI region 104 within openings 128b, and gate spacers 120 and dielectric layer 126 within the field adjacent to and between openings 128b. Further, dopants 146 may be implanted into exposed portions of fins 102 within openings 128b.

Dopants 146 may include p-type or n-type dopants. N-type dopants may include, but are not limited to: phosphorous (P), arsenic (As), antimony (Sb). N-type is an element introduced to a semiconductor to generate a free electron (by "donating" an electron to the semiconductor). The n-type element must have one more valance electron than the semiconductor. Common donors in silicon (Si) include phosphorous (P), arsenic (As), antimony (Sb) and common donors in gallium arsenic (GaAs) include sulphur (S), selenium (Se), tin (Sn), silicon (Si), and carbon (C). P-type dopants may include, but are not limited to: boron (B), indium (In) and gallium (Ga). P-type is an element introduced to a semiconductor to generate a free hole (by "accepting" an electron from the semiconductor atom and "releasing" a hole at the same time). The p-type element must have one valence electron less than the host semiconductor. Boron (B) is the most common acceptor in silicon technology. However, alternatives include indium and gallium.

As shown, as dopants 146 are implanted into exposed portions of fins 102, to create a channel 148 (represented by dotted line). As will be described herein, channel 148 provides electrical connection from source/drain region 124 to an active gate structure.

Figure 7:
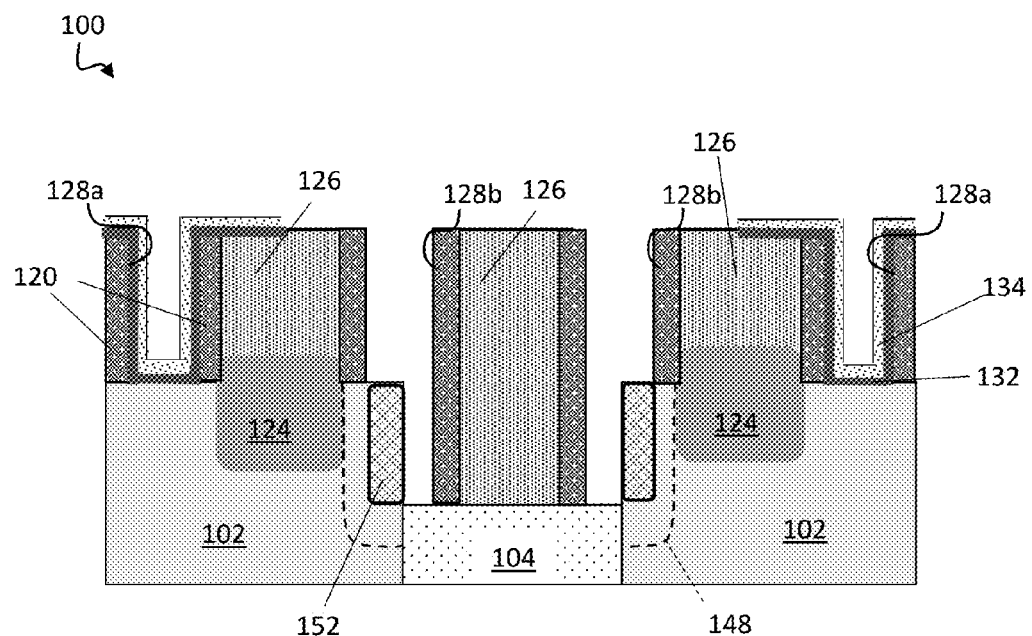
FIGS. 7-8 show the preliminary IC structure of FIG. 6 undergoing aspects of a method in which a silicide region is formed.

Turning now to FIG. 7, mask 142 (FIG. 6) may be removed from IC structure 100 and silicide regions 152 may be formed within exposed portions of fins 102 that are within openings 128b. Silicide regions 152 may be formed by depositing a refractory metal (not shown) over IC structure 100. That is, the refractory metal may be formed such that it lines openings 128b including over a portion of fins 102 exposed within openings 128b. Further, the refractory metal may be formed over capping layer 134 within openings 128a, and over capping layer 134, gate spacers 120, and dielectric layer 126 within the field between openings 128a, 128b. The refractory metal may include, for example, tungsten, titanium, molybdenum, nickel, tantalum, cobalt, etc., and combinations thereof. The refractory metal may be nitrogen-enriched by sputter deposition or atomic layer deposition of nitrogen. The sputter deposition process results in the bombardment of nitrogen into the refractory metal. Subsequently, an RTA process may be performed to create silicide regions 152. The RTA process results in the reaction of the nitrogen-enriched refractory metal with the underlying silicon of fins 102 within openings 128b to create silicide regions 152. In such a process, atoms of the nitrogen-enriched refractory metal diffuses into portions of fins 102. As such, silicide region 152 is a nitrogen-enriched metal silicide layer. As shown in FIG. 7, no silicide is formed in openings 128a or within the field between openings 128a, 128b because no silicon (e.g., from fins 102) is exposed to react with the nitrogen-enriched refractory metal during the anneal process. After silicide regions 152 are formed, any remaining unreacted nitrogen-enriched refractory metal may be removed, e.g., via etching.

Figure 8:
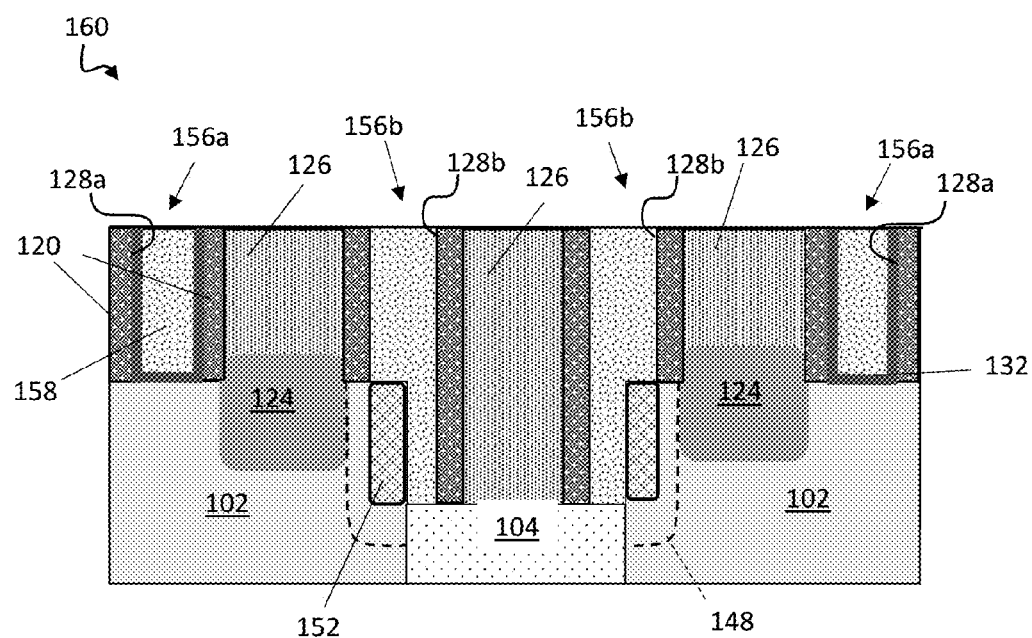

Turning now to FIG. 8, capping layer 134 (FIG. 7) may be removed, e.g., via etching, to expose high-k layer 132 thereunder. Further, active gate structures 156a, 156b may be formed within openings 128a, 128b. Gate structures 156a, 156b may be formed by deposition of conventional active gate stack materials such as, work function metal layers, optional barrier layers, and gate conductor layers, denoted together herein as "gate stack materials" 158 and shown as a single layer in FIG. 8 for brevity. As known in the art, work function metal layers may act as a doping source, and a different work function setting metal can then be employed depending on whether a n-type field-effect-transistor (NFET) or a p-type field-effect-transistor (PFET) device is desired. Thus, the same gate conductor can be used in each of the devices, yet a different (if so desired) work function setting metal can be used in one or more devices to obtain a different doping polarity. By way of example only, suitable work function setting metals for use in PFET devices include, but are not limited to aluminum, dysprosium, gadolinium, and ytterbium. Suitable work function setting metals for use in NFET devices include, but are not limited to lanthanum, titanium, and tantalum. Optional barrier layers may include, for example, titanium nitride, tantalum nitride, hafnium nitride, hafnium silicon nitride, titanium silicon nitride, tantalum silicon nitride, tungsten nitrogen carbide, and hafnium aluminum nitride. Gate conductor layers may include, for example, at least one of: titanium, titanium nitride, tungsten, tungsten nitride, copper, copper nitride, tantalum, or tantalum nitride.

Gate stack materials 158 may be conformally deposited in any order dependent on the intended application for gate structures 156a, 156b. Gate stack materials 158 may be formed over high-k layer 132 within openings 128a to substantially fill openings 128a and over the field between openings 128a, 128b. Within openings 128b, gate stack materials 158 may be formed over silicide regions 152 within fins 102 and over exposed STI regions 104 to substantially fill openings 128b. Subsequently, gate stack materials 158 may be planarized to a top surface of dielectric layer 126 and/or gate spacers 120. As shown, gate structures 156a, 156b are disposed between gate spacers 120 within dielectric layer 126. FIG. 8 shows the resulting IC structure after planarization of gate stack materials 158 to form gate structures 156a, 156b.

Figure 9:
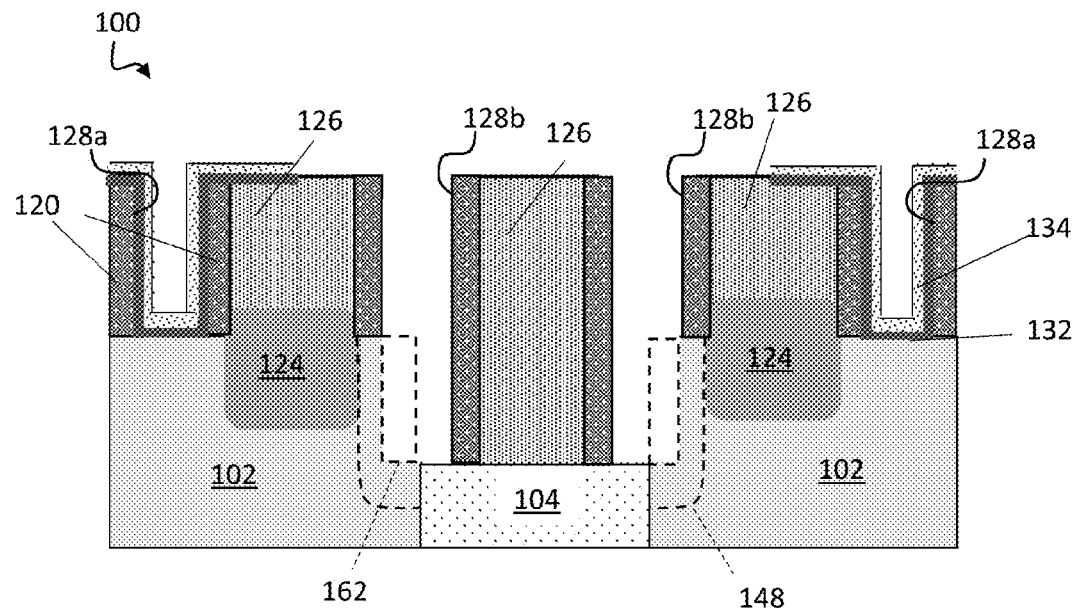
FIGS. 9-10 show the preliminary IC structure of FIG. 6 undergoing aspects of a method in which an opening is expanded such that the opening is self-aligned with a pair of gate spacers.
Figure 10:
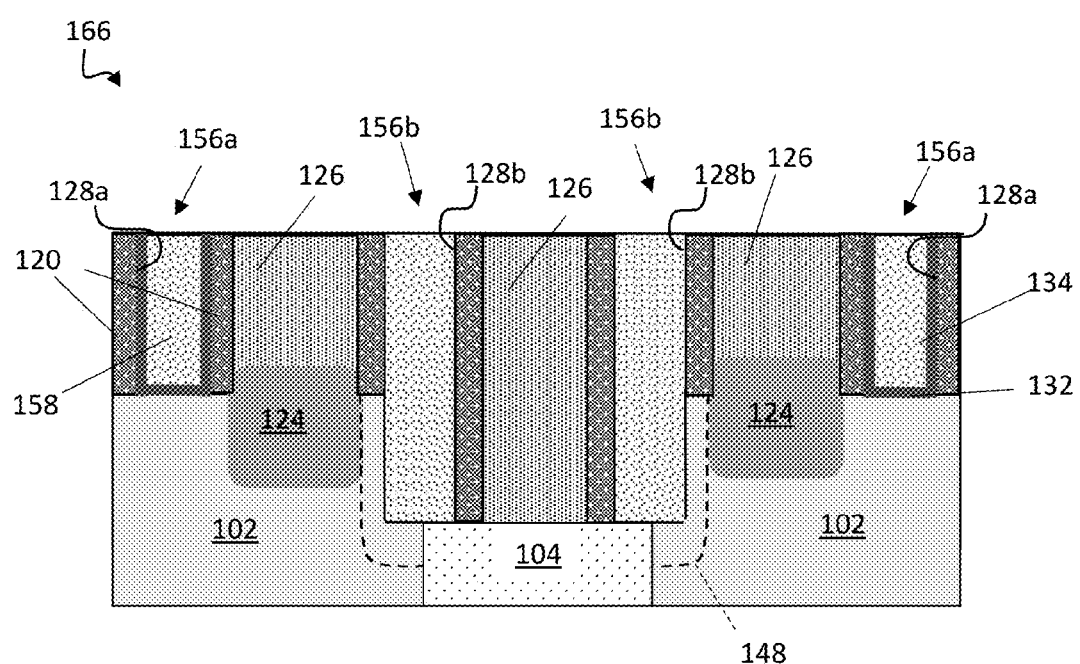

Turning now to FIG. 9, another embodiment of the disclosure is shown. In this embodiment, after dopants 146 are implanted as discussed with respect to FIG. 6, exposed portions (represented by dotted box 162) of fins 102 within openings 128b may be etched via RIE. RIE does not etch insulators, thus, gate spacers 120 and STI 104 act as a natural stop for the etching of the exposed portions of fin 102. Therefore, the etching expands openings 128b such that openings 128b are self-aligned with gate spacers 120. As shown in FIG. 10, capping layer 134 may be removed, e.g., via etching, from openings 128a. Further, gate stack materials 158 may be formed within openings 128a, 128b to create active gate structures 156a, 156b as described with respect to FIG. 8.

The embodiment according to FIGS. 9-10 differs than that of the embodiment according to FIGS. 7-8 in that the embodiment of FIGS. 9-10 does not include silicide regions 152 (FIGS. 7-8) from the exposed portions of fins 102 within openings 128b. Rather, the exposed portions 162 (FIG. 9) of fins 102 are etched such that openings 128b are expanded. FIG. 10 shows the resulting IC structure 166 after planarization of gate stack materials 158 according to this embodiment.

Figure 11:
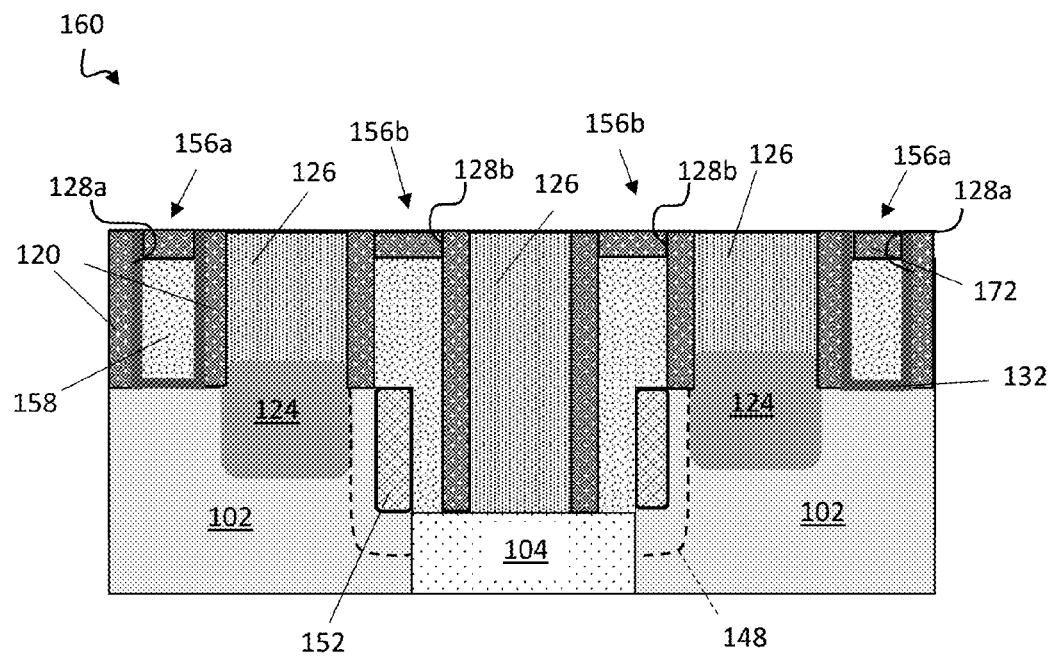
FIG. 11 shows the IC structure of FIG. 8 wherein a gate cap layer is formed.
Figure 12:
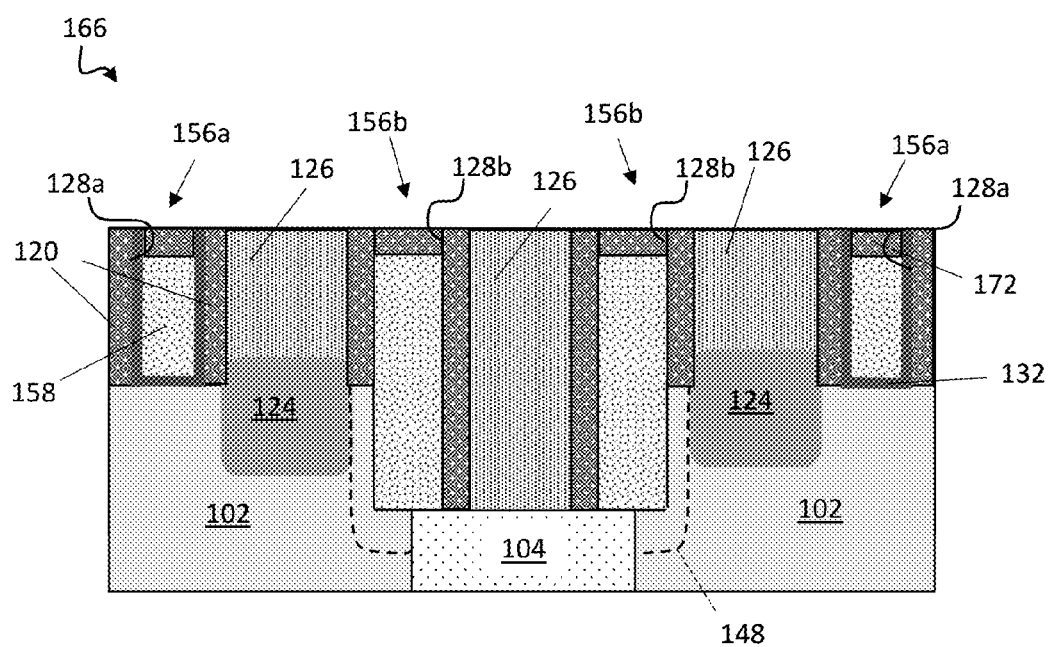
FIG. 12 shows the IC structure of FIG. 10 wherein a gate cap layer is formed.

Referring now to FIGS. 11-12 together, the method may continue in both embodiments, i.e., the embodiment of FIGS. 7-8 and the embodiment of FIG. 9-10, with the formation of gate cap layers 172. FIG. 11 shows IC structure 160 according to the embodiments of FIGS. 7-8 and FIG. 12 shows IC structure 166 according to the embodiments of FIGS. 9-10. In either embodiment, gate stack materials 158 may be recessed, e.g., via etching, to create openings (not shown) defined by the remaining portions of gate stack materials 158 and high-k layer 132 lining gate spacers 120. The openings may be filled, e.g., via deposition, with gate cap layer materials. Subsequently, the gate cap layer materials may be planarized to a top surface of dielectric layer 126 and/or gate spacers 120. Gate cap layers 172 may include, for example, at least one of: an oxide, e.g., silicon dioxide, or a nitride, e.g., silicon nitride.

Figure 13:
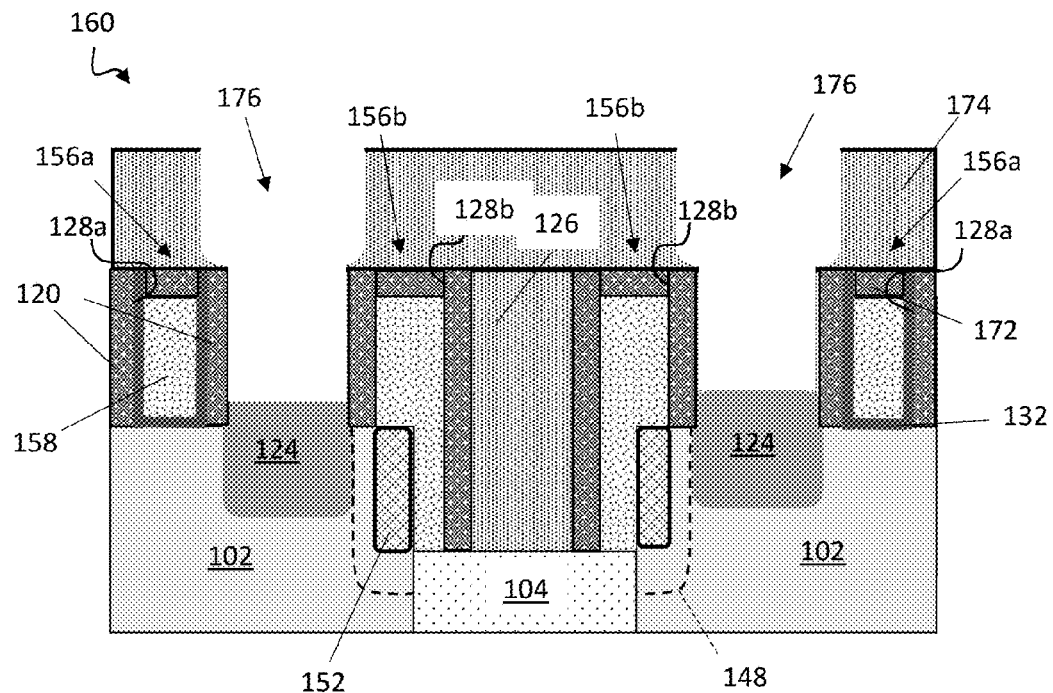
FIG. 13 shows the IC structure of FIG. 11 wherein an opening is formed within a dielectric layer to expose the source/drain region.
Figure 14:
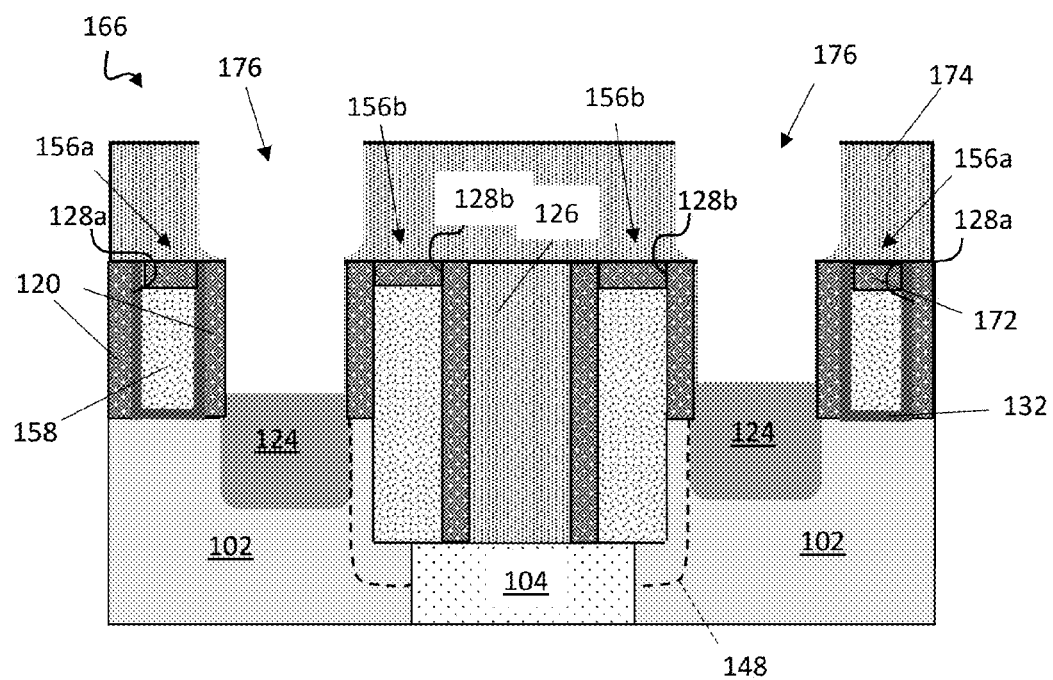
FIG. 14 shows the IC structure of FIG. 12 wherein an opening is formed within a dielectric layer to expose the source/drain region.

As shown in FIGS. 13-14, the method may continue in both embodiments with the formation of dielectric layer 174. FIG. 13 shows IC structure 160 according to the embodiments of FIGS. 7-8 and FIG. 14 shows IC structure 166 according to the embodiments of FIGS. 9-10. In either embodiment, dielectric layer 174 may include any of the dielectric layer materials discussed herein with respect to dielectric layer 126 such that dielectric layer 174 may be composed of the same material as dielectric layer 126. Dielectric layer 174 may be formed over gate structures 156a, 156b, gate spacers 120, and dielectric layer 126. After formation of dielectric layer 174, a mask (not shown) may be deposited over dielectric layer 174, patterned and etched to expose portions of dielectric layer 174 that are over source/drain regions 124. The exposed portions of dielectric layer 174 may then be etched to form openings 176. Etching may continue through dielectric layer 126 to source/drain regions 124 within fins 102 such that openings 176 expose source/drain regions 124.

Figure 15:
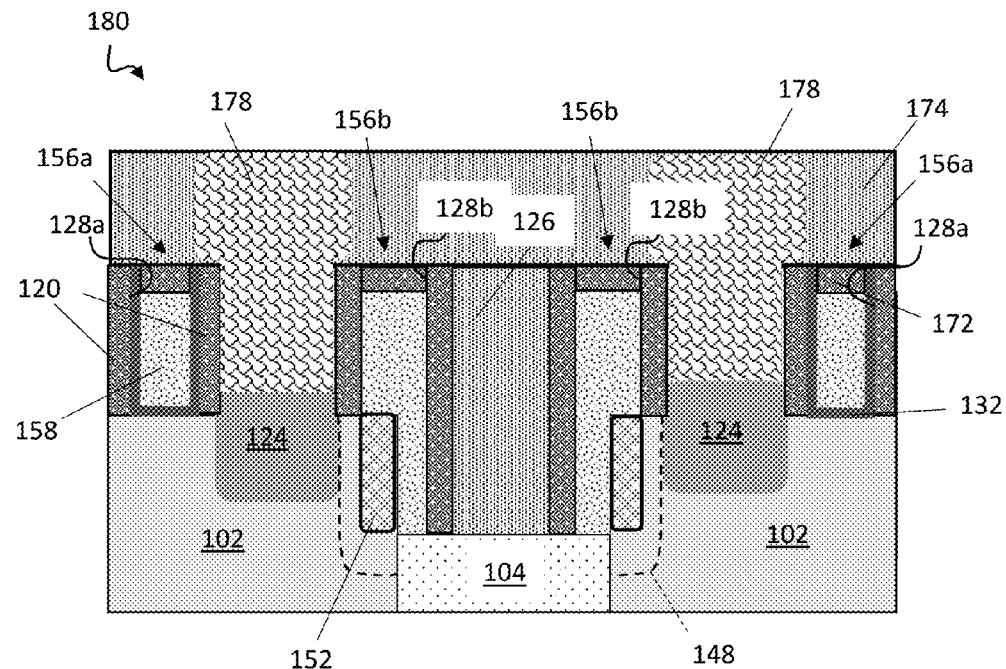
FIG. 15 shows the IC structure of FIG. 13 wherein a source/drain contact is formed within the dielectric layer to the source/drain region.
Figure 16:
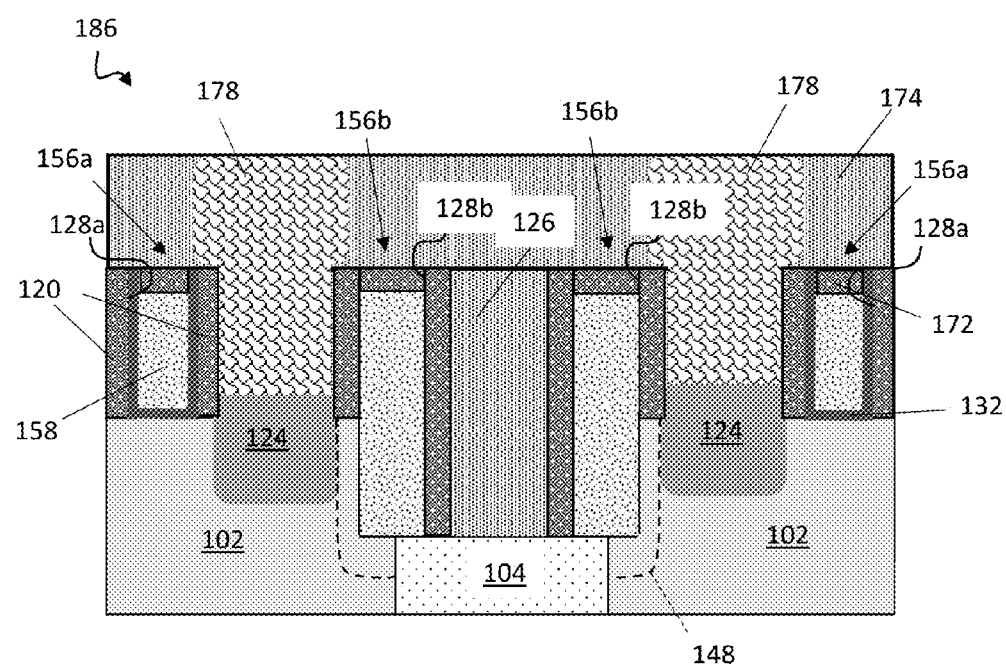
FIG. 16 shows the IC structure of FIG. 14 wherein a source/drain contact is formed within the dielectric layer to the source/drain region.

Turning to FIGS. 15-16, the method may continue in both embodiments with the formation of source/drain contacts 178. FIG. 15 shows IC structure 160 (FIG. 13) according to the embodiments of FIGS. 7-8 and FIG. 16 (FIG. 14) shows IC structure 166 according to the embodiments of FIGS. 9-10. In either embodiment, source/drain contacts 178 may be formed within openings 176 (FIGS. 13-14). Source/drain contacts 178 may be formed such that source/drain contacts 178 directly contact source/drain regions 124 within fins 102. Source/drain contacts 178 provide electrical connection from source/drain regions 124 to other devices which may be formed in metal levels above dielectric layer 174. Source/drain contacts 178 may be formed by forming a refractory metal (not shown) within openings 176 and over the field between openings 176. Further, a conductor (not shown)

may be formed over the refractory metal layer. An anneal may be performed such that a silicide (not shown) is formed at an interface of the refractory metal and source/drain regions 124. A planarization technique may be employed before or after the anneal such that any remaining portions of refractory metal layer and the conductor are removed such that source/drain contacts 178 are planar with a top surface of dielectric layer 174. The refractory metal may include any refractory metals discussed herein and the conductor may include any of the conductive metal materials discussed herein.

Referring only to FIG. 15, a resulting IC structure 180 after formation of source/drain contacts 178 according to the embodiments of FIGS. 7-8 is shown. IC structure 180 may include gate structures 156*a* over and around fins 102 between gate spacers 120. Gate structures 156*a* may include high-k layer 132 over fins 102 and substantially lining a vertical length of gate spacers 120. Further, gate structures 156*a* may include gate stack materials 158 over high-k layer 132. Gate structures 156*b* may be disposed over and around a portion of fins 102 and over STI region 104 between gate spacers 120. A portion of gate structures 156*b* may be disposed over silicide regions 152 within fins 102. Gate structures 156*b* may include gate stack materials 158 over silicide regions 152 and STI region 104. Gate cap layers 172 may be disposed over gate stack materials 158 between gate spacers 120.

Fins 102 may include source/drain regions 124 between adjacent gate structures 156*a*, 156*b*. Overlying source/drain regions 124 may be source/drain contacts 178. Source/drain contacts 178 may extend from source/drain regions 124 to a top surface of dielectric layer 174. Dielectric layer 174 may be disposed over gate structures 156*a*, 156*b*, gate spacers 120, and dielectric layer 126.

Referring only to FIG. 16, a resulting IC structure 186 after formation of source/drain contacts 178 according to the embodiments of FIGS. 9-10 is shown. IC structure 186 may include gate structures 156*a* over and around fins 102 between gate spacers 120. Gate structures 156*a* may include high-k layer 132 over fins 102 and substantially lining a vertical length of gate spacers 120. Further, gate structures 156*a* may include gate stack materials 158 over high-k layer 132. Gate structures 156*b* may be disposed over and around a portion of fins 102 and over STI region 104 between gate spacers 120. Gate structures 156*b* may include gate stack materials 158 over silicide regions 152 and STI region 104. Gate cap layers 172 may be disposed over gate stack materials 158 between gate spacers 120.

Fins 102 may include source/drain regions 124 between adjacent gate structures 156*a*, 156*b*. Overlying source/drain regions 124 may be source/drain contacts 178. Source/drain contacts 178 may extend from source/drain regions 124 to a top surface of dielectric layer 174. Dielectric layer 174 may be disposed over gate structures 156*a*, 156*b*, gate spacers 120, and dielectric layer 126. As previously discussed herein, IC structure 186 according to this embodiment does not include silicide regions 152.

Referring to FIGS. 15-16 together, channel 148 together with source/drain region 124 provides electrical connection from gate structures 156*b* to source/drain contacts 178. Since gate structures 156*b* are connected to source/drain contacts 178 in this way, a separate gate contact is not needed as used in conventional IC structures. Source/drain contacts 178 and gate structures 156*b* are cross-coupled by electrical shorting through the end of fins 102 at STI region 104. The ends of fins 102 at STI region 104 are silicided or etched, and self-aligned to gate spacers 120, to provide a reduction in stray capacitance.

It is to be understood that the method may continue with back-end-of-the-line (BEOL) construction (not shown). In such a case, additional dielectric layers may be formed over dielectric layer 174 and source/drain contacts 178 and additional devices (not shown) may be formed therein. The additional devices may be connected to IC structures 180, 186 by source/drain contacts 178.

Referring now to FIGS. 17-20, another embodiment of the disclosure is shown. The methods and structures according to this embodiment, include a source/drain contact directly connected to a gate conductor of a gate structure through sidewalls of the gate structure. In such an embodiment, a gate contact is not necessary, as the source/drain contact provides electrical connection from both the source/drain region and the gate conductor of the gate structure to metal levels, and devices therein, that are above the gate structure.

Figure 17:
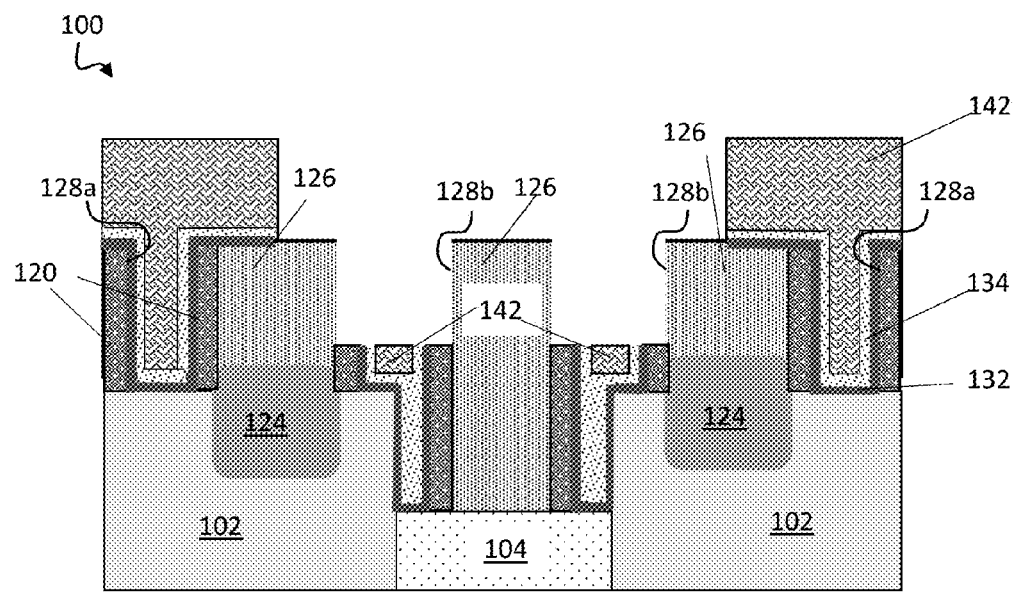
FIGS. 17-20 show the preliminary IC structure of FIG. 5 undergoing aspects of a method according to another embodiment of the disclosure.

The method according to this embodiment may start as described with respect to FIGS. 1-5. However, after mask 142 is formed, mask 142 may be recessed within openings 128*b* as shown in FIG. 17. Further, portions of gate spacers 120, high-k layer 132 and capping layer 134 that are not covered by mask 142 may be removed such that gate spacers 120, high-k layer 132, and capping layer 134 are recessed to a top surface of mask 142 within openings 128*b* thereby expanding a width of openings 128*b*. Subsequently, mask 142 (FIG. 17) may be removed as shown in FIG. 18.

Figure 18:
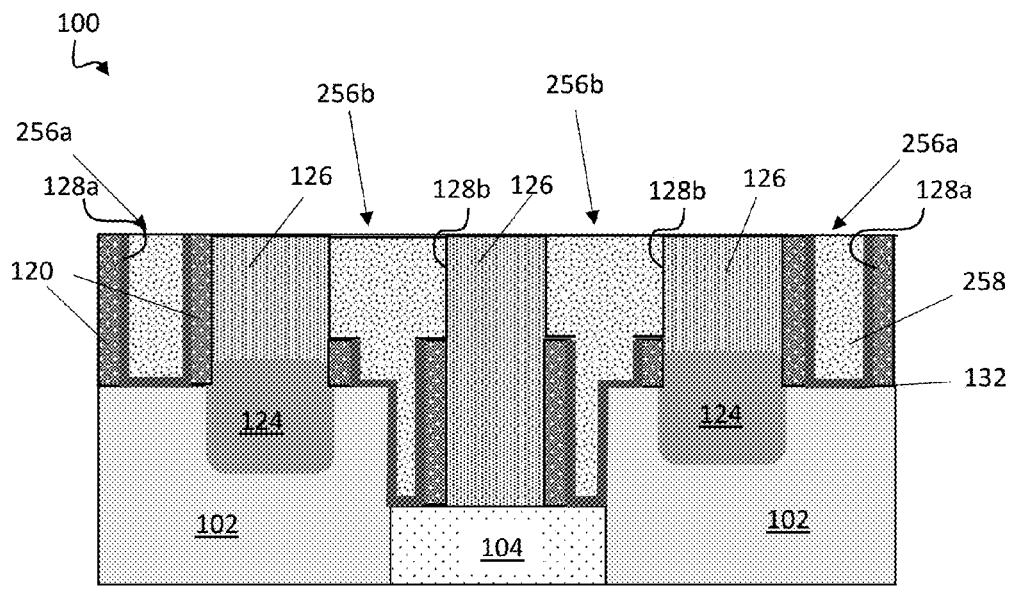

As also shown in FIG. 18, capping layer 134 may be removed from openings 128*a*, 128*b* to expose high-k layer 132 thereunder. Further, active gate structures 256*a*, 256*b* may be formed within openings 128*a*, 128*b*. Gate structures 256*b* may be formed over portions of the recessed gate spacers 120 within openings 128*b*. Gate structures 256*a*, 256*b* may be formed by deposition of conventional active gate stack materials such as, work function metal layers, optional barrier layers, and gate conductor layers, denoted together herein as "gate stack materials" 258 and shown as a single layer in FIG. 18 for brevity. Work function metal layers, optional barrier layers, and gate conductor layers may include any of the work function metal layer, barrier layer, and gate conductor layer materials discussed herein.

Gate stack materials 258 may be conformally deposited in any order dependent on the intended application for gate structures 256*a*, 256*b*. Gate stack materials 258 may be formed over high-k layer 132 within openings 128*a*, 128*b* to substantially fill openings 128*a*, 128*b* and over the field between openings 128*a*, 128*b*. Subsequently, gate stack materials 258 may be planarized to a top surface of dielectric layer 126 and/or gate spacers 120. As shown, gate structures 256*a*, 256*b* are disposed between gate spacers 120 within dielectric layer 126. FIG. 18 shows the resulting IC structure after planarization of gate stack materials 258 to form gate structures 256*a*, 256*b*.

Figure 19:
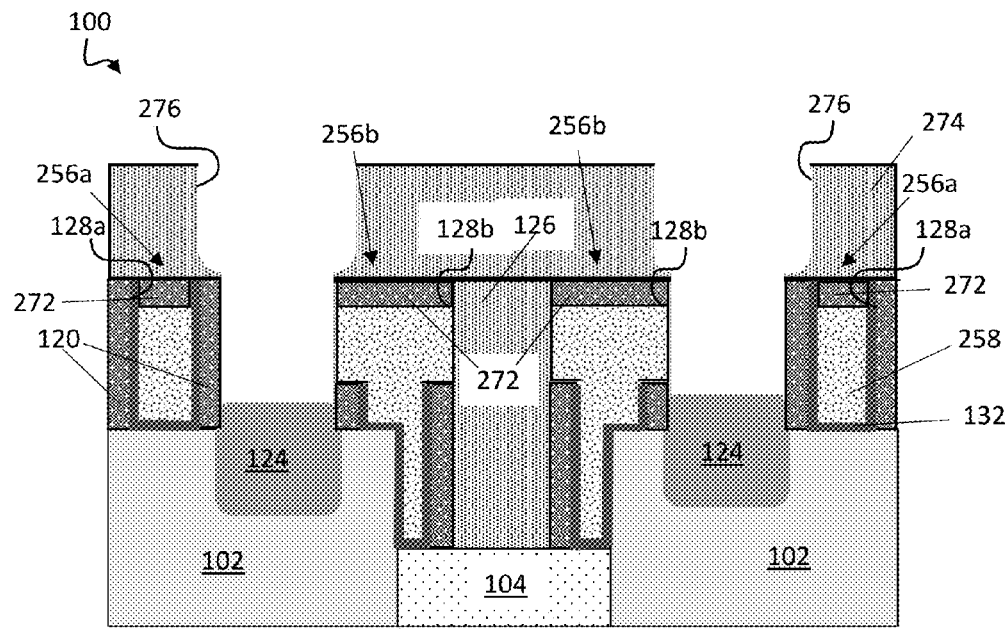

Turning now to FIG. 19, the method may continue with the formation of gate cap layers 272. Gate cap layers 272 may be formed by recessing gate stack materials 258, e.g., via etching, to create openings (not shown) defined by the remaining portions of gate stack materials 258 and high-k layer 132 lining gate spacers 120. The openings may be filled, e.g., via deposition, with gate cap layer materials. Subsequently, the gate cap layer materials may be planarized to a top surface of dielectric layer 126 and/or gate spacers 120. Gate cap layers 272 may include any of the gate cap layer materials discussed herein.

Additionally, a dielectric layer 274 may be formed over portions of gate structures 256*a*, 256*b*, gate spacers 120, and dielectric layer 126. Dielectric layer 274 may include any of the dielectric layer materials discussed herein such that dielectric layer 274 may be composed of the same material as dielectric layer 126. After formation of dielectric layer 274, a mask (not shown) may be deposited over dielectric layer 274, patterned and etched to expose portions of dielectric layer 274 that are over source/drain regions 124. The exposed portions of dielectric layer 274 may then be etched to form openings 276. Etching may continue through dielectric layer 126 to source/drain regions 124 within fins 102 such that openings 276 expose source/drain regions 124. Further, etching of openings 276 may expose a portion of gate structure 256b over recessed gate spacers 120.

Figure 20:
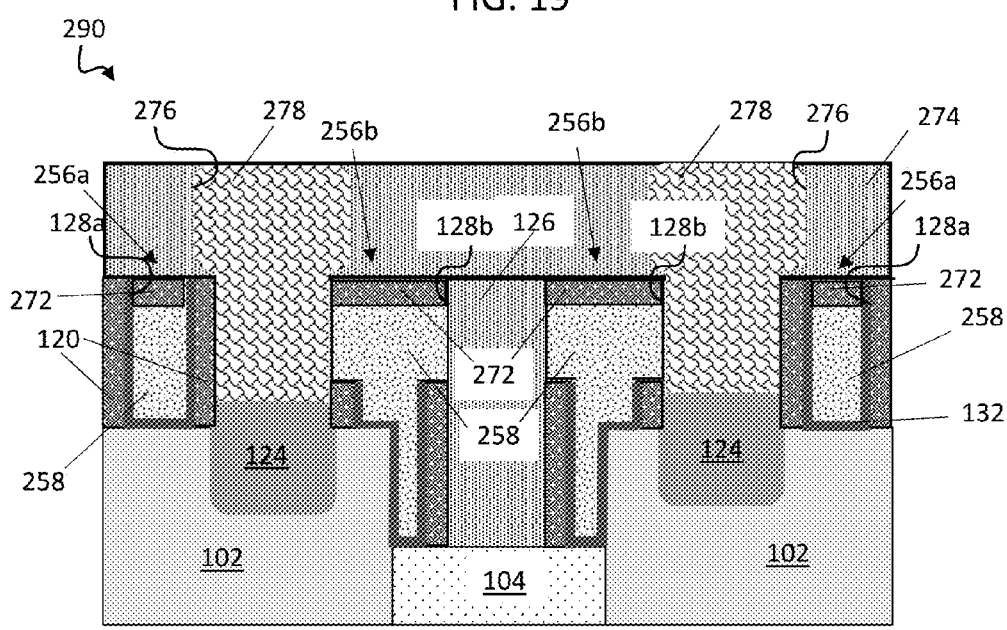

Turning to FIG. 20, the method may continue with the formation of source/drain contacts 278 to form a resulting IC structure 290. Source/drain contacts 278 may be formed within openings 276. Source/drain contacts 278 may be formed such that source/drain contacts 278 directly contact source/drain regions 124 within fins 102. Source/drain contacts 278 provide electrical connection from source/drain regions 124 to other devices which may be formed in metal levels above dielectric layer 274. Source/drain contacts 278 may be formed by forming a refractory metal (not shown) within openings 276 and over the field between openings 276. Further, a conductor (not shown) may be formed over the refractory metal layer. An anneal may be performed such that a silicide (not shown) is formed at an interface of the refractory metal and source/drain regions 124. Subsequently, a planarization technique may be employed such that any remaining portions of refractory metal layer and the conductor are removed such that source/drain contacts 278 are planar with a top surface of dielectric layer 274. The refractory metal may include any refractory metals discussed herein and the conductor may include any of the conductive materials discussed herein.

Additionally, as shown in FIG. 20, source/drain contacts 278 are directly connected to gate stack material 258, or more specifically, to the gate conductor (not individually shown) and/or work function metals (not individually shown) within gate stack material 258, beneath gate cap layers 272. That is, source/drain contacts 278 may be directly connected to the gate conductor through at least one sidewall of gate structures 256b. As such, source/drain contacts 278 not only provide electrical connection of source/drain region 124 to devices in metal levels above dielectric layer 274, but also provide electrical connection of gate structures 256b to the same. Therefore, IC structure 290 does not include a separate gate contact.

Figure 21:
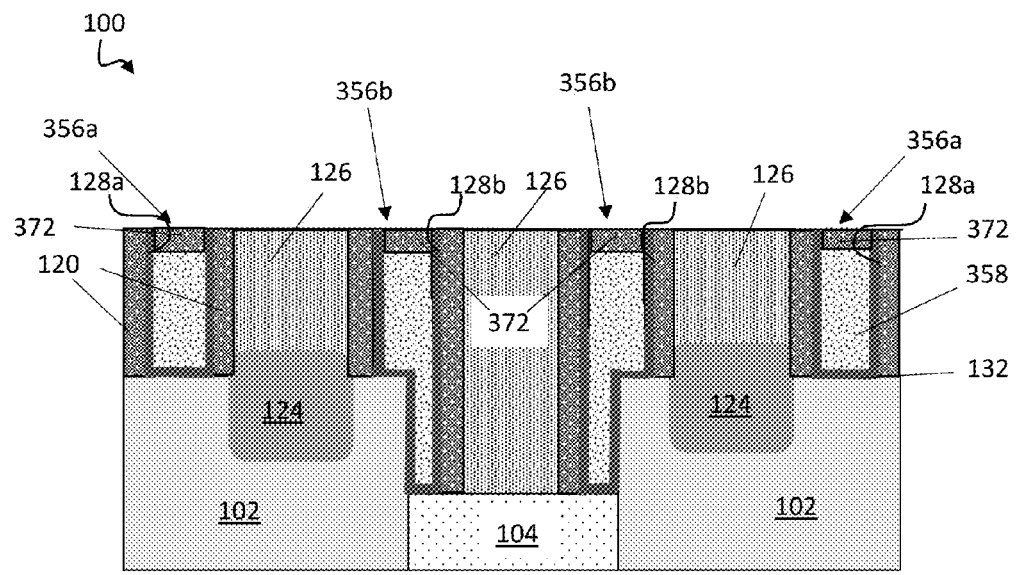
FIGS. 21-24 show the preliminary IC structure of FIG. 4 undergoing aspects of a method according to another embodiment of the disclosure.

FIGS. 21-24 show another embodiment of the disclosure. As shown in FIG. 21, in this embodiment, IC structure 100 high-k layer 132 may be formed as described with respect to FIG. 4. However, instead of forming capping layer 134 (FIG. 4), gate stack materials 358 may be formed over high-k layer 132 within openings 128a, 128b to form gate stacks 356a, 356b. Gate stack materials 358 may include any of the gate stack materials discussed herein. Further, gate stack materials 358 may be recessed, e.g., via etching, to create openings (not shown) defined by the remaining portions of gate stack materials 358 and high-k layer 132 lining gate spacers 120. The openings may be filled, e.g., via depositing, with gate cap layer materials. Subsequently, the gate cap layer materials may be planarized to a top surface of dielectric layer 126 and/or gate spacers 120 to create gate cap layers 372 over gate stack materials 358. Gate cap layers 372 may include any of the gate cap layer materials discussed herein.

Figure 22:
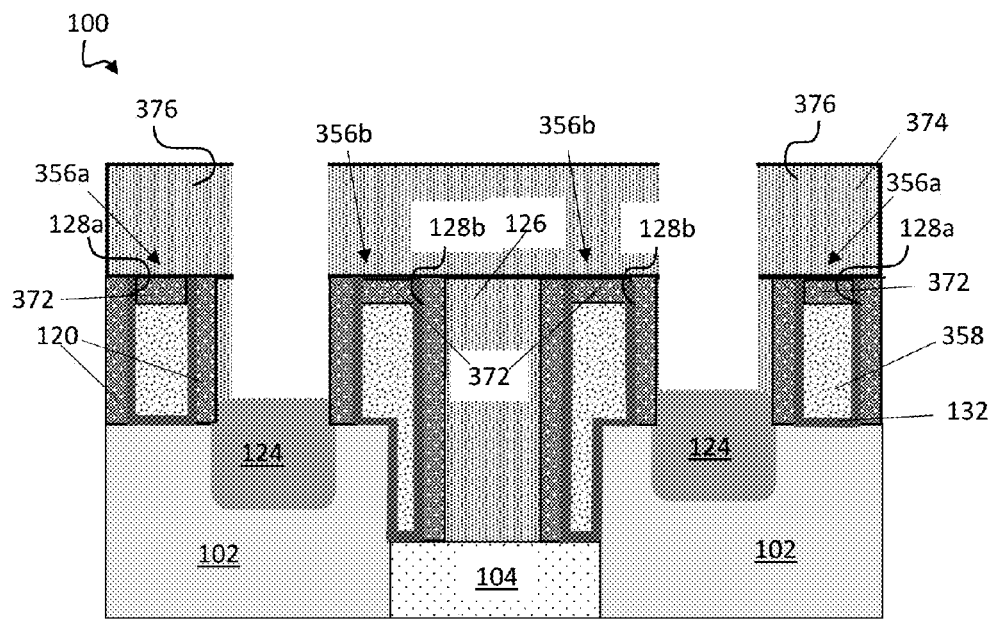

Referring now to FIG. 22, dielectric layer 374 may be formed over IC structure 100. Dielectric layer 374 may include any of the dielectric layer materials discussed herein such that dielectric layer 374 may be composed of the same material as dielectric layer 126. Dielectric layer 374 may be formed over gate structures 356a, 356b, gate spacers 120, and dielectric layer 126. After formation of dielectric layer 374, a mask (not shown) may be deposited over dielectric layer 374, patterned and etched to expose portions of dielectric layer 374 that are over source/drain regions 124. The exposed portions of dielectric layer 374 may then be etched to form openings 376. Etching may continue through dielectric layer 126 to source/drain regions 124 within fins 102 such that openings 376 expose source/drain regions 124. In this embodiment, the mask may be formed such that etching down to the source/drain region 124 exposes gate spacers 120 adjacent to gate stacks 356b, but does not expose gate spacers 120 adjacent to gate stacks 356a.

Figure 23:
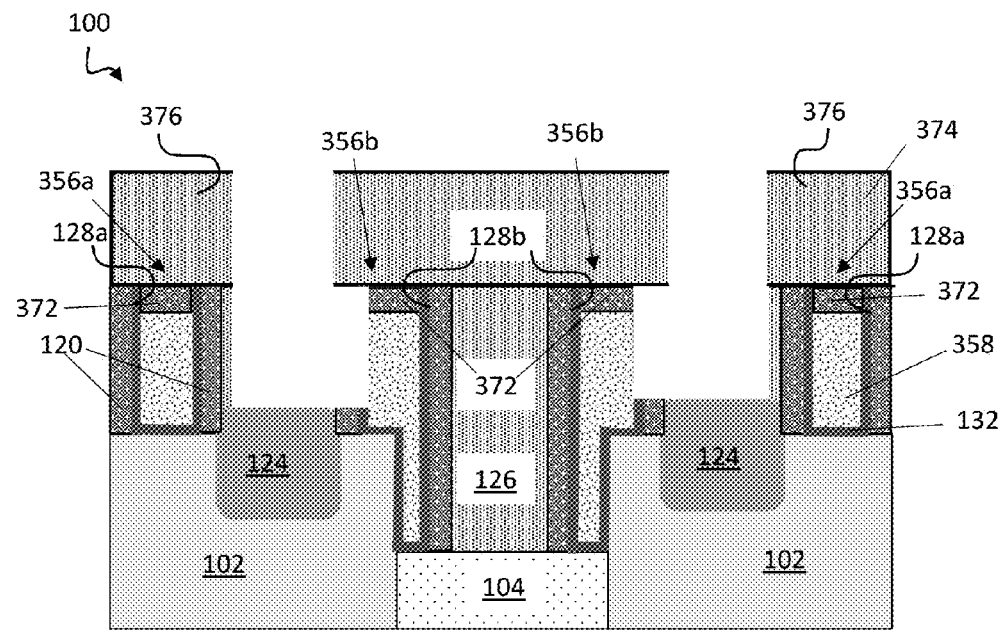

Turning now to FIG. 23, portions of gate spacers 120 adjacent to gate stacks 356b that are exposed by openings 376 may be removed such that openings 376 are expanded. The portions of gate spacers 120 may be removed by etching, such as an isotropic etching. The etching may also remove high-k layer 132 that was lining the removed portions of gate spacers 120 such that gate stack materials 358, or more specifically, gate conductor 358 is exposed.

Figure 24:
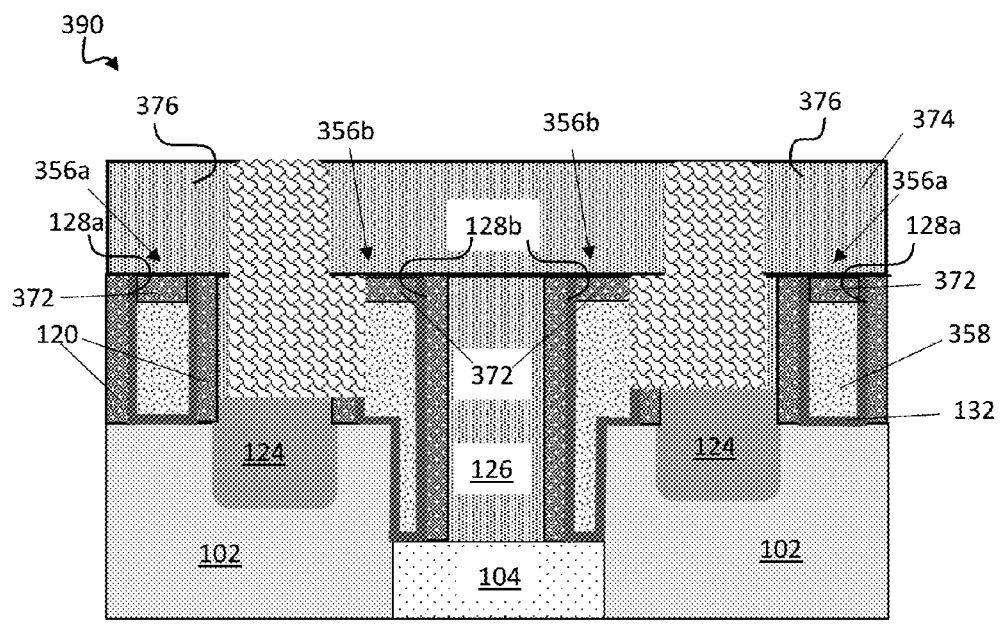
Figure 25:
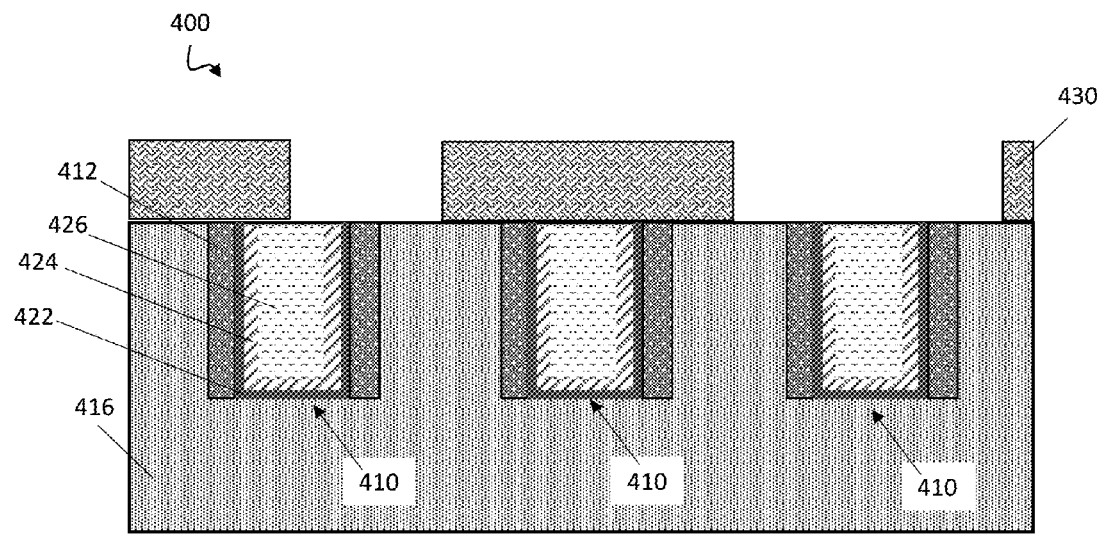
FIGS. 25-28 show an IC structure undergoing aspects of a method according to another embodiment of the disclosure where

As shown in FIG. 24, the method may continue with the formation of source/drain contacts 378 to form a resulting IC structure 390. Source/drain contacts 378 may be formed within openings 376. Source/drain contacts 378 may be formed such that source/drain contacts 378 directly contact source/drain regions 124 within fins 102. Source/drain contacts 378 provide electrical connection from source/drain regions 124 to other devices which may be formed in metal levels above dielectric layer 374. Source/drain contacts 378 may be formed by forming a refractory metal (not shown) within openings 376 and over the field between openings 376. Further, a conductor (not shown) may be formed over the refractory metal layer. An anneal may be performed such that a silicide (not shown) is formed at an interface of the refractory metal and source/drain regions 124. Subsequently, a planarization technique may be employed such that any remaining portions of refractory metal layer and the conductor are removed such that source/drain contacts 378 are planar with a top surface of dielectric layer 374. The refractory metal may include any refractory metals discussed herein and the conductor may include any of the conductive materials discussed herein.

Additionally, as shown in FIG. 24, source/drain contacts 378 are directly connected to gate stack material 358, or more specifically to the gate conductor (not shown) within gate stack material 358, beneath gate cap layers 372. That is, source/drain contacts 378 may be directly connected to the gate conductor through at least one sidewall of gate structures 356b. As such, source/drain contacts 378 not only provide electrical connection of source/drain region 124 to devices in metal levels above dielectric layer 374, but also provide electrical connection of gate structures 356b to the same. Therefore, IC structure 390 does not include a separate gate contact.

FIGS. 25-28 show another embodiment of the disclosure. In this embodiment, a preliminary IC structure 400 is shown. IC structure 400 may include dummy gate structures 410 within a logic region of an IC. Dummy gate stacks 410 may be formed between a pair of gate spacers 412 within a dielectric layer 416 via conventional photolithographic techniques. Dummy gate stacks 410 may include a high-k layer 422, a work function metal layer 424, and a dummy gate material 426. Dielectric layer 416, high-k layer 422, work function metal layer 424, and dummy gate material 426 may include any of the materials discussed herein relative to dielectric layers, high-k layers, work function metal layers, and dummy gate materials, respectively.

A mask 430 may be formed, e.g., via depositing, over IC structure 430. Mask 430 may include any of the mask materials discussed herein. Mask 430 may be patterned and etched to expose portions of dummy gate stacks 410, gate spacers 412, and dielectric layer 416 where etching of IC structure 400 is desired. That is, mask 430 may be patterned and etched to where it is desirable to remove portions of dielectric layer 416, gate spacers 412, high-k layer 422, and work function metal layer 424 in order to expose portions of dummy gate material 426.

Figure 26:
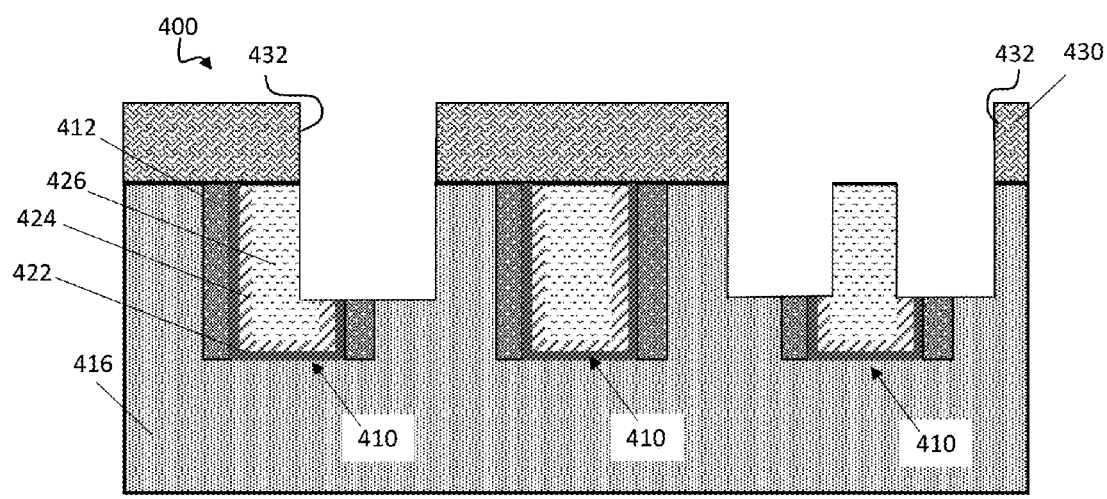
Figure 27:
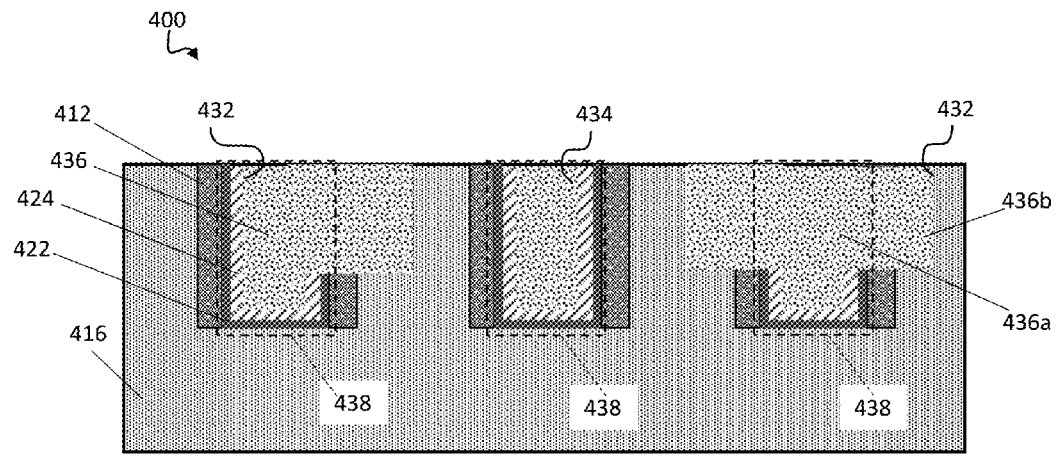

Turning now to FIG. 26, the portions of dielectric layer 416, gate spacers 412, high-k layer 422, and work function metal layer 424 that are exposed by mask 430 may be removed, via, etching, to create openings 432. As a result, portions of dummy gate materials 426 within dummy gate stacks 410 may be exposed. Subsequently, mask 430 may be removed, e.g., via etching. Turning now to FIG. 26, dummy gate material 426 may be removed, via etching, as shown in FIG. 26. The removal of dummy gate material 426 results in openings 432 expanding into the regions where dummy gate material 426 was removed from. Further, the removal of dummy gate material 426 results in the creation of openings 434 within gate structures that were previously covered by mask 430 (FIG. 26). Openings 432, 434 may be filled with a conductor 436, e.g., via depositing and planarization. Conductor 436 may include any conductive metal material discussed herein. Conductor 436 results in formation of a gate conductor 436a for active gate structures 438 (outlined in dotted lined box), or replacement metal gate structures. Further, formation of conductor 436 results in conductor 436b adjacent to gate structures 438.

Figure 28:
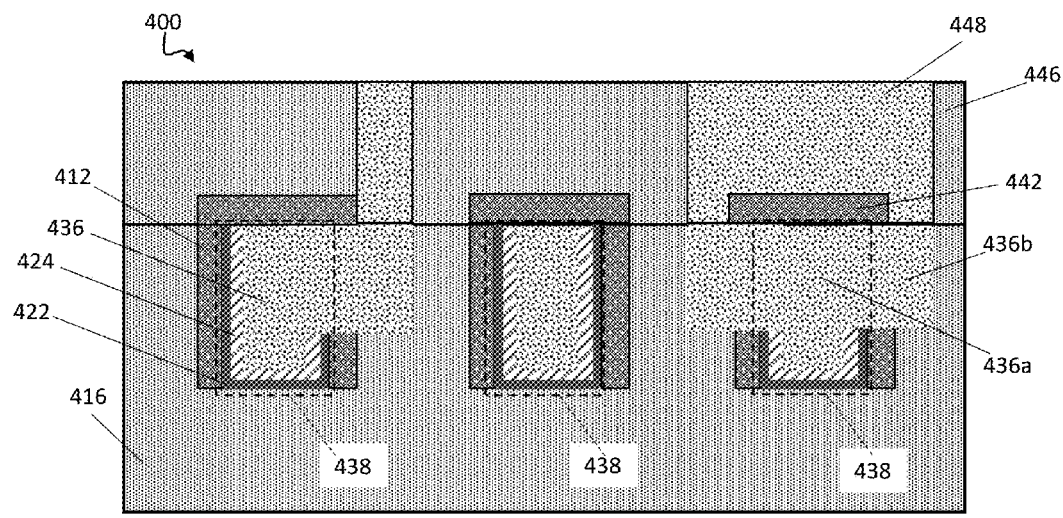

As shown in FIG. 28, gate cap layers 442 may be formed over gate structures 438 and gate spacers 412. Gate cap layers 442 may be formed by conventional lithographic techniques. Gate cap layers 442 may include any of the gate cap layer materials discussed herein. Further, another dielectric layer 446 may be formed, e.g., via deposition, over gate cap layer 442 and dielectric layer 416. Dielectric layer 446 may include any of the dielectric layer materials discussed herein such that dielectric layer 446 may be of the same composition as dielectric layer 416. After formation of dielectric layer 446, another mask (not shown) may be deposited over dielectric layer 446. The mask may be patterned and etched to expose portions of dielectric layer 446 which are desired to be removed to expose portions of conductor 436 within dielectric layer 416 that are not covered by gate cap layer 442. The exposed portions of dielectric layer 446 may be removed to create openings (not shown) which expose the portions of conductor 436 within dielectric layer 416 that are not covered by gate cap layer 442. The openings may be filled with another conductor 448, e.g., via depositing and planarization. Conductor 448 may include any of the conductive metal materials discussed herein. In some embodiments, conductor 448 may include the same material as conductor 436. Conductor 448 provides electrical connection from gate structures 438 within an STI region to other devices (not shown) which may be formed in metal levels (not shown) above dielectric layer 446.

As shown in FIG. 28, conductor 448 may be directly connected to gate conductor 436a of gate structures 438 through at least one sidewall of gate structures 438. In some embodiments (shown), conductor 448 may be directly connected to gate conductor 436a of gate structures 438 through opposing sidewalls of gate structures 438. Additionally, conductor 448 may be electrically connected to gate conductor 436a beneath gate cap layers 442. It is to be understood that this embodiment, in the STI region for example, may be formed before, after, or simultaneously as the previous embodiments described herein.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of forming an integrated circuit structure, the method comprising:
removing a dummy gate stack from between a pair of gate spacers within a dielectric layer thereby forming a first opening within the dielectric layer, the first opening exposing a portion of a fin and a portion of a shallow trench isolation (STI) region that is adjacent to the fin;
forming a gate structure within the first opening;
forming a second opening within the dielectric layer to expose a source/drain region within the fin, the second opening being adjacent to the gate structure; and forming a source/drain contact within the second opening to the source/drain region, wherein the source/drain contact also functions as a gate contact.

2. The method of claim 1, further comprising:
after the removing of the dummy gate stack and prior to the forming of the gate structure, implanting the exposed portion of the fin with a semiconductor species to create a channel region within the fin.

3. The method of claim 2, wherein the channel region and the source/drain region together provide electrical connection from the source/drain contact to the gate structure.

4. The method of claim 2, further comprising:
after implanting the exposed portion of the fin with the semiconductor species and prior to forming the gate structure, forming a silicide region within the channel region within the fin adjacent to the STI region.

5. The method of claim 4, wherein the silicide region within the fin is self-aligned with at least one gate spacer within the pair of gate spacers.

6. The method of claim 2, further comprising:
after implanting the exposed portion of the fin with the semiconductor species and prior to forming the gate structure, removing a portion of the channel region within the fin thereby expanding the first opening such that the first opening is self-aligned with the pair of gate spacers.

7. The method of claim 1, further comprising:
after removing the dummy gate stack and prior to forming the gate structure, forming a high-k layer within the first opening over the exposed portion of the fin and the STI region; and
forming a capping layer over the high-k layer within the first opening.

8. The method of claim 7, further comprising:
after forming the capping layer and prior to forming the gate structure, removing the high-k layer and the capping layer from within the first opening.

9. The method of claim 7, further comprising:
after forming the capping layer and prior to forming the gate structure, recessing a portion of each gate spacer in the pair of gate spacers, the high-k layer, and the capping layer within the first opening; and
removing the remaining portions of the capping layer from the first opening,
wherein forming the gate structure includes forming the gate structure over the recessed portion of each gate spacer in the pair of gate spacers.

10. The method of claim 9, wherein forming the second opening exposes a portion of the gate structure over at least one of the recessed gate spacers in the pair of gate spacers, and
wherein forming the source/drain contact includes forming the source/drain contact in direct contact with the gate structure such that the source/drain contact is in electrical connection with the gate structure.

11. The method of claim 1, further comprising:
wherein the forming of the second opening includes removing a portion of at least one gate spacer in the pair of gate spacers to expose the gate structure, and
wherein forming the source/drain contact includes forming the source/drain contact in direct contact with the gate structure such that the source/drain contact is in electrical connection with the gate structure.

12. The method of claim 1, further comprising:
after forming the gate structure and prior to forming the second opening, forming a gate cap layer over the gate structure.

13. The method of claim 12, further comprising:
after forming the gate cap and prior to forming the second opening, forming a second dielectric layer over the first dielectric layer,
wherein forming the second opening includes forming the second opening through the second dielectric layer and the first dielectric layer to expose the source/drain region.

* * * * *